US011332488B2

United States Patent
Anthis et al.

(10) Patent No.: US 11,332,488 B2
(45) Date of Patent: *May 17, 2022

(54) METAL PRECURSORS WITH MODIFIED DIAZABUTADIENE LIGANDS FOR CVD AND ALD AND METHODS OF USE

(71) Applicant: Applied Materials, Inc., Santa Clara, CA (US)

(72) Inventors: Jeffrey W. Anthis, San Jose, CA (US); Atashi Basu, Menlo Park, CA (US); David Thompson, San Jose, CA (US); Nasrin Kazem, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 16/996,459

(22) Filed: Aug. 18, 2020

(65) Prior Publication Data
US 2020/0377538 A1    Dec. 3, 2020

Related U.S. Application Data

(62) Division of application No. 15/947,695, filed on Apr. 6, 2018, now Pat. No. 10,752,649.
(Continued)

(51) Int. Cl.
*C07F 15/06* (2006.01)
*C23C 16/455* (2006.01)
*C23C 16/18* (2006.01)

(52) U.S. Cl.
CPC ........... *C07F 15/065* (2013.01); *C23C 16/18* (2013.01); *C23C 16/45553* (2013.01)

(58) Field of Classification Search
None
See application file for complete search history.

(56) References Cited

U.S. PATENT DOCUMENTS 6,786,936 B2 * 9/2004 Vaartstra ................. C23C 16/18
                                                    29/25.01
10,577,386 B2 * 3/2020 Schmiege ......... C23C 16/45553
(Continued)

FOREIGN PATENT DOCUMENTS

JP  WO2016143456  * 9/2016  ........... C07C 251/08
KR  20160088699 A    7/2016
(Continued)

OTHER PUBLICATIONS

International Search Report and Written Opinion in PCT/US2018/026605 dated Nov. 30, 2018, 13 pages.
(Continued)

*Primary Examiner* — Clinton A Brooks
(74) *Attorney, Agent, or Firm* — Servilla Whitney LLC

(57) ABSTRACT

Metal coordination complexes comprising at least one diazabutadiene based ligand having a structure represented by:

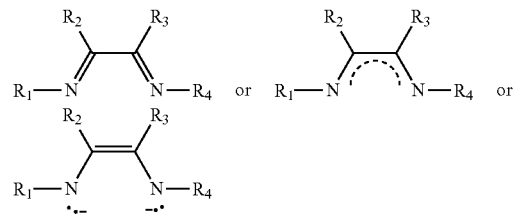

where $R_1$ and $R_4$ are selected from the group consisting of C4-C10 alkyl groups; and $R_2$ and $R_3$ are each independently selected from the group consisting of H, C1-C6 alkyl, cycloalkyl, or aryl groups and the difference in the number (Continued)

of carbons in $R_2$ and $R_3$ is greater than or equal to 2. Processing methods using the metal coordination complexes are also described.

18 Claims, 1 Drawing Sheet

Related U.S. Application Data

(60) Provisional application No. 62/483,027, filed on Apr. 7, 2017.

(56) References Cited

U.S. PATENT DOCUMENTS

| | | |
|---|---|---|
| 2013/0164456 A1 | 6/2013 | Winter |
| 2013/0251903 A1 | 9/2013 | Han |
| 2014/0242298 A1 | 8/2014 | Lansalot-Matras et al. |
| 2016/0307905 A1 | 10/2016 | Lansalot-Matras |
| 2017/0058401 A1 | 3/2017 | Blackwell et al. |
| 2018/0037540 A1* | 2/2018 | Yoshino ............ C23C 16/45553 |

FOREIGN PATENT DOCUMENTS

| | | |
|---|---|---|
| WO | 2015065823 A1 | 5/2015 |
| WO | 2015136365 A1 | 9/2015 |
| WO | 2016143456 A1 | 9/2016 |

OTHER PUBLICATIONS

DeKimpe, Terahedron 48(15), 1992, 3183-208.
Kim, J., et al., "Low-Temperature Atomic Layer Deposition of Cobalt Oxide as an Effective Catalyst for Photoelectrochemical Water-Splitting Devices", Chemistry of Materials, Jun. 28, 2017, vol. 29, No. 14, pp. 5796-5805.
Klesko, J.P., et al., "Low Temperature Thermal Atomic Layer Deposition of Cobalt Metal Films", Chemistry of Materials, Jan. 21, 2016, vol. 28, No. 3, pp. 700-703.

* cited by examiner

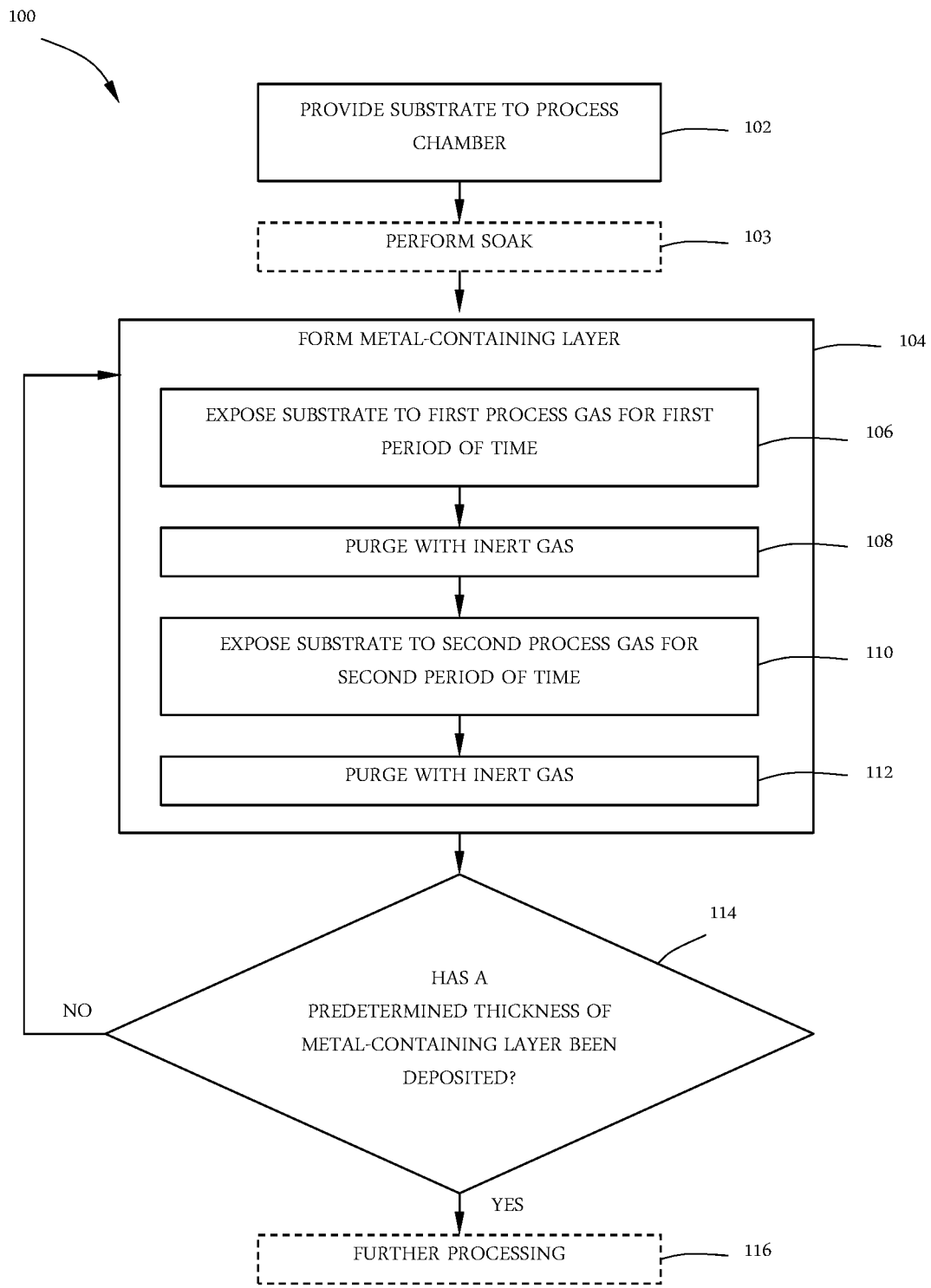

METAL PRECURSORS WITH MODIFIED DIAZABUTADIENE LIGANDS FOR CVD AND ALD AND METHODS OF USE

CROSS-REFERENCE TO RELATED APPLICATIONS

This application is a divisional application of U.S. patent application Ser. No. 15/947,695, filed Apr. 6, 2018, which claims the benefit of U.S. Provisional Application No. 62/483,027, filed Apr. 7, 2017, the entire disclosures of which are hereby incorporated by reference.

FIELD

Embodiments of the disclosure relate to metal complex precursors with increased reactivity for thin film deposition. More particularly, embodiments of the disclosure are directed to metal complex precursors containing modified diazabutadiene ligands and methods of use.

BACKGROUND

The semiconductor industry continues to strive for continuous device miniaturization that is driven by the need for mobile and high-performance systems in emerging industries such as autonomous vehicles, virtual reality, and future mobile devices. To accomplish this feat, new, high-performance materials are needed to circumvent inherent engineering and physics issues encountered in the rapid reduction of feature sizes in microelectronic devices.

Ideally, thin-films of metal would be deposited using thin-film deposition techniques such as Chemical Vapor Deposition (CVD) and Atomic Layer Deposition (ALD) owing to their inherent ability to deposit material in a high-throughput, conformal, and precise fashion.

Chemical vapor deposition (CVD) is one of the most common deposition processes employed for depositing layers on a substrate. CVD is a flux-dependent deposition technique that uses precise control of the substrate temperature and the precursors introduced into the processing chamber in order to produce a desired layer of uniform thickness. The reaction parameters become more critical as substrate size increases, creating a need for more complexity in chamber design and gas flow technique to maintain adequate uniformity.

A variant of CVD that demonstrates excellent step coverage is cyclical deposition or atomic layer deposition (ALD). Cyclical deposition is based upon atomic layer epitaxy (ALE) and employs chemisorption techniques to deliver precursor molecules on a substrate surface in sequential cycles. The cycle exposes the substrate surface to a first precursor, a purge gas, a second precursor and the purge gas. The first and second precursors react to form a product compound as a film on the substrate surface. The cycle is repeated to form the layer to a desired thickness.

The advancing complexity of advanced microelectronic devices is placing stringent demands on currently used deposition techniques. Unfortunately, there are a limited number of viable chemical precursors available that have the requisite properties of robust thermal stability, high reactivity, and vapor pressure suitable for film growth to occur. Additionally, metal precursors often use oxygen or an oxidizing co-reagent for deposition. Use of oxygen and oxidizing co-reagents can be incompatible with adjacent films in the device stack. Therefore, there is a need in the art for metal precursors and co-reagents that react to form metal and metal-based thin films, and metal precursors that can form metal films without an oxidizing co-reagent.

SUMMARY

One or more embodiments of the disclosure are directed to a metal coordination complex comprising at least one ligand according to

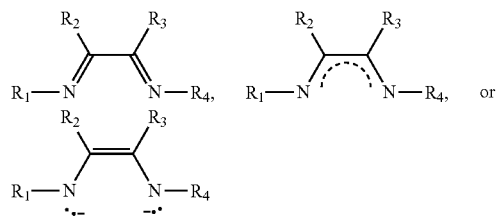

wherein $R_1$ and $R_4$ are selected from the group consisting of C4-C10 alkyl groups; and $R_2$ and $R_3$ are each independently selected from the group consisting of H, C1-C6 alkyl, cycloalkyl, or aryl groups and the difference in the number of carbons in $R_2$ and $R_3$ is greater than or equal to 2.

Additional embodiments of the disclosure are directed to a metal coordination complex of the general formula $M[R_1N=CH(R_2)(R_3)HC=NR_4]_aX_bY_c$, wherein $R_1$ and $R_4$ are selected from the group consisting of C4-C10 alkyl groups; $R_2$ and $R_3$ are each independently selected from the group consisting of H, C1-C6 alkyl, cycloalkyl, or aryl groups and the difference in the number of carbons in $R_2$ and $R_3$ is greater than or equal to 2; X in an anionic ligand; Y is a neutral ligand; a is 1-4; b is 0-8; and c is 0-8.

Further embodiments of the disclosure are directed to a processing method comprising exposing a substrate to a first reactive gas comprising a metal coordination complex and a second reactive gas to form a metal-containing film, the metal coordination complex comprising at least one ligand according to

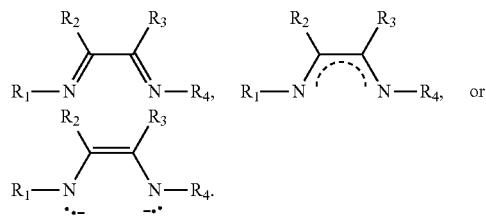

where $R_1$ and $R_4$ are selected from the group consisting of C4-C10 alkyl groups; and
each of $R_2$ and $R_3$ are independently selected from the group consisting of H, C1-C6 alkyl, cycloalkyl, or aryl groups and the difference in the number of carbons in $R_2$ and $R_3$ is greater than or equal to 2.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

The FIGURE illustrates an exemplary process sequence for the formation of a metal layer using a two pulse cyclical deposition technique according to one embodiment described herein.

DETAILED DESCRIPTION

Embodiments of the disclosure provide precursors and processes for depositing metal-containing films. The process of various embodiments uses vapor deposition techniques, such as an atomic layer deposition (ALD) or chemical vapor deposition (CVD) to provide metal films.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In an aspect of a spatial ALD process, a first reactive gas and second reactive gas (e.g., hydrogen radicals) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

One or more embodiments of the disclosure are directed to a class of metal coordination complexes with diazabutadiene ligands for CVD and ALD processes. The diazabutadiene ligand is represented by the formula (I)

wherein $R_1$ and $R_4$ are selected from the group consisting of C4-C10 alkyl groups; and $R_2$ and $R_3$ are each independently selected from the group consisting of H, C1-C6 alkyl, cycloalkyl, or aryl groups and the difference in the number of carbons in $R_2$ and $R_3$ is greater than or equal to 2. As used in this manner, the letter "C" followed by a numeral (e.g., "C4") means that the substituent comprises the specified number of carbon atoms (e.g., C4 comprises four carbon atoms).

The diazabutadiene ligand can adopt several resonance forms when binding to a metal center as depicted in scheme (II).

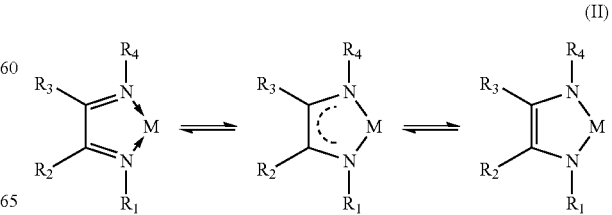

The inventors have found that larger groups in the $R_1$ and $R_4$ positions increase the reactivity of the metal coordination complex. In some embodiments, the $R_1$ and $R_4$ groups are t-butyl groups. In some embodiments, the $R_1$ and $R_4$ groups are 1,1-dimethylpropyl groups. In some embodiments, the $R_1$ and $R_4$ groups have more than four, five, six, seven, eight or nine carbon atoms. In some embodiments, the $R_1$ and $R_4$ groups have more than four carbon atoms and at least two branches. As used in this regard, the term "branches" refers to carbon substituents that extend from a carbon backbone of the $R_1$ and $R_4$ group. For example, a 3,4-dimethylhexyl group has two branches, one methyl branch at the 3 position and one methyl branch at the 4 position. In some embodiments, the size of the $R_1$ and $R_4$ groups is sufficient so that a metal center with two ligands will have a tetrahedral geometry.

In some embodiments, the $R_1$ and $R_4$ groups are the same. In some embodiments, the $R_1$ and $R_4$ groups are independently selected from the group consisting of C4 to C10 alkyl groups.

Non-hydrogen groups as $R_2$ or $R_3$ have been found to lower the melting point of the metal complex. In some embodiments, at least one of the $R_2$ or $R_3$ groups is not hydrogen. In one or more embodiments, at least one of $R_2$ or $R_3$ comprises an alkyl group having 2, 3, 4 or 5 or more carbon atoms. In some embodiments, the $R_2$ or $R_3$ groups are straight chain alkyl groups. In some embodiments, one of the $R_2$ or $R_3$ groups is a straight chain alkyl or hydrogen and the other of the $R_2$ or $R_3$ groups is branched. In some embodiments, the difference in size between the $R_2$ and the $R_3$ groups is sufficient to increase the rotational entropy of the ligand and resulting metal complex to lower the melting point of the complex.

In some embodiments, the metal coordination complex comprises at least one ligand according to

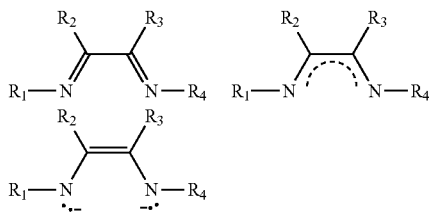

where $R_1$ and $R_4$ are independently selected from the group consisting of C4-C10 alkyl groups; and $R_2$ and $R_3$ are each independently selected from the group consisting of H, C1-C6 alkyl, cycloalkyl, or aryl groups and the difference in the number of carbons in $R_2$ and $R_3$ is greater than or equal to 2. In some embodiments, the difference in carbon atoms between $R_2$ and $R_3$ is greater than or equal to 3, 4, 5, 6 or 7.

In some embodiments, $R_1$ and $R_4$ are 1,1-dimethyl propyl groups. In some embodiments, $R_1$ and $R_4$ are t-butyl groups. In some embodiments, $R_2$ is an ethyl group and $R_3$ is hydrogen.

In some embodiments the metal atom is cobalt. In some embodiments, the metal atom is selected from the group consisting of Cu, Ni, Co, Cr, Mn, Fe, W, Mo, Ti, Zr, Hf, Rf, V, Nb, Ta, Re, Ru, Rh, Ir, Pd, Pt, Au and combinations thereof.

In one or more embodiments, the metal coordination complex has the general formula, $M[R_1N=CH(R_2)(R_3)HC=NR_4]_aX_bY_c$, where $R_1$ and $R_4$ are independently selected from the group consisting of C4-C10 alkyl groups; $R_2$ and $R_3$ are each independently selected from the group consisting of H, C1-C6 alkyl, cycloalkyl, or aryl groups and the difference in the number of carbons in $R_2$ and $R_3$ is greater than or equal to 2; X in an anionic ligand; Y is a neutral donor ligand; a is 1-4; b is 0-8; and c is 0-8.

In some embodiments, $R_1$ and $R_4$ are 1,1-dimethyl propyl groups. In some embodiments, $R_1$ and $R_4$ are t-butyl groups. In some embodiments, $R_2$ is an ethyl group and $R_3$ is hydrogen. In some embodiments, b is 0 and c is in the range of 1 to 8. In some embodiments, b is in the range of 1 to 8 and c is 0. In some embodiments, b and c are 0.

The number of diazadiene-based ligands, anionic ligands and neutral ligands can vary. In some embodiments, the combination of ligands results in a metal coordination complex in which the metal atom has an oxidation state of neutral, +1, +2, +3, +4, +5, +6, +7, +8 or +9.

In some embodiments, the complex includes at least one anionic ligand (X). The anionic ligand of some embodiments comprises one or more of $F^-$, $Cl^-$, $Br^-$, $I^-$, $OH^-$ or $CN^-$.

In some embodiments, the complex includes at least one neutral donor ligand (Y). In some embodiments, the neutral donor ligand comprises a solvent molecule. The neutral donor ligand of some embodiments comprises one or more of $H_2O$, NO, $NR''_3$, $PR''_3$, dimethyl ether (DME), tetrahydrofuran (THF), tetramethylethylenediamine (TMEDA), CO, acetonitrile, pyridine, ammonia, ethylenediamine, and/or triphenylphosphine. where each R" is independently H, C1-C6 alkyl or aryl group.

In some embodiments, a processing method comprising exposing a substrate to a first reactive gas comprising a metal coordination complex and a second reactive gas to form a metal-containing film; the metal coordination complex comprising at least one ligand according to

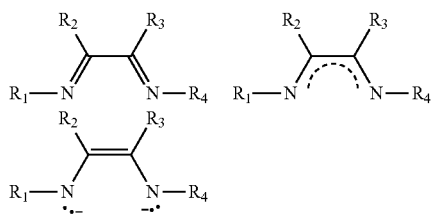

where $R_1$ and $R_4$ are selected from the group consisting of C4-C10 alkyl groups; and
each of $R_2$ and $R_3$ are independently selected from the group consisting of H, C1-C6 alkyl, cycloalkyl, or aryl groups and the difference in the number of carbons in $R_2$ and $R_3$ is greater than or equal to 2.

In some embodiments, the substrate is exposed to the first reactive gas and the second reactive gas sequentially. In some embodiments, the substrate is exposed to the first reactive gas and the second reactive gas simultaneously.

In some embodiments, the second reactive gas comprises one or more of $H_2$, $NH_3$, hydrazine, hydrazine derivatives, $O_2$, $O_3$, $H_2O$, $NO_2$, $N_2O$ or plasmas thereof. In some embodiments, the second reactive gas comprises a silicon-containing compound and the metal-containing film comprises metal silicide ($MSi_x$).

In some embodiments, the metal-containing film comprises greater than or equal to about 95 percent metal. In some embodiments the metal atom is cobalt. In some embodiments, the metal atom is selected from the group consisting of Cu, Ni, Co, Cr, Mn, Fe, W, Mo, Ti, Zr, Hf, Rf, V, Nb, Ta, Re, Ru, Rh, Ir, Pd, Pt, Au and combinations thereof.

The metal coordination complex can be a monomer or a dimer. In some embodiments, the metal coordination complex is a dimer with a ligand linking two metal atoms (e.g., Ir). In some embodiments, the metal coordination complex is a dimer with the two metal atoms linked directly.

The complexes of some embodiments may react as precursors in an ALD or CVD process to form thin films. Suitable reactants include, but are not limited to, $H_2$, $NH_3$, hydrazine, hydrazine derivatives and other co-reactants to make metal or $M_xN_y$ films. Suitable reactants also include, but are not limited to, $O_2$, $O_3$, water and other oxygen based co-reactants to make metal or $M_xO_y$ films. Plasma treatments of a co-reactant or as a post-treatment may also be used.

The FIGURE depicts a method for forming an metal-containing layer on a substrate in accordance with one or more embodiment of the disclosure. The method 100 generally begins at 102, where a substrate, having a surface upon which an metal-containing layer is to be formed is provided and placed into a processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the metal-containing layer, for example, by polishing, etching, reduction, oxidation, halogenation, hydroxylation, annealing, baking, or the like.

The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate such that the metal-containing layer may be at least partially formed thereon. For example, in some embodiments, a layer comprising a metal, a nitride, an oxide, or the like, or combinations thereof may be disposed on the substrate and may have the metal containing layer formed upon such layer or layers.

In some embodiments, the substrate may be exposed to an optional soak process 103 prior to beginning the cyclical deposition process to form an metal-containing layer on the substrate (as discussed below at 104), as shown in phantom at 103. In one or more embodiments, the method of depositing the metal-containing layer on the substrate 104 does not include a soaking process.

At 104, an metal-containing layer is formed on the substrate. The metal-containing layer may be formed via a cyclical deposition process, such as atomic layer deposition (ALD), or the like. In some embodiments, the forming of an metal-containing layer via a cyclical deposition process may generally comprise exposing the substrate to two or more process gases sequentially. In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The process of forming the metal-containing layer at step 104 may begin by exposing the substrate to a first reactive gas. In some embodiments, the first reactive gas comprises an metal precursor (also referred to as an metal-containing gas, and the like) and is exposed to the substrate for a first period of time, as shown at 106.

The metal-containing gas may be provided in one or more pulses or continuously. The flow rate of the metal-containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The metal-containing gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the metal-containing gas may be any suitable amount of time necessary to allow the metal precursor to form an adequate nucleation layer atop the substrate surfaces. For example, the process gas may be flowed into the process chamber for a period of about 0.1 seconds to about 90 seconds. In some time-domain ALD processes, the metal-containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the metal-containing gas. The inert gas may be mixed with the metal-containing gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the metal-containing gas is mixed with argon prior to flowing into the process chamber.

The temperature of the substrate during deposition can be controlled, for example, by setting the temperature of the substrate support or susceptor. In some embodiments the substrate is held at a temperature in the range of about 100° C. to about 600° C., or in the range of about 200° C. to about 525° C., or in the range of about 300° C. to about 475° C., or in the range of about 350° C. to about 450° C. In one or more embodiments, the substrate is maintained at a temperature less than about 475° C., or less than about 450° C., or less than about 425° C., or less than about 400° C., or less than about 375° C.

In addition to the foregoing, additional process parameters may be regulated while exposing the substrate to the metal-containing process gas. For example, in some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

Next, at 108, the process chamber (especially in time-domain ALD) may be purged using an inert gas. (This may not be needed in spatial ALD processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas at 106. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of greater than 0 to about 10000 sccm to purge the process chamber. In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess metal-containing gas from the process chamber, preventing a reaction between the metal precursor and a subsequent reactive gas.

Next, at 110, the substrate is exposed to a second process gas for a second period of time. The second process gas reacts with the metal-containing compound on the substrate surface to create a deposited film. The second process gas can impact the resulting metal film. For example, when the second process gas is $H_2$, an metal film is deposited, but when the second reactive gas is silane or disilane, an metal silicide film may be deposited.

In some embodiments, the second reactive gas comprises one or more of $H_2$, $NH_3$, hydrazine, hydrazine derivatives, or plasmas thereof. In some embodiments, the second reactive gas is selected to deposit a metal film (e.g., an metal film) or a metal nitride (e.g., $Ir_xN_y$) on the substrate.

In some embodiments, the second reactive gas comprises one or more of $O_2$, $O_3$, $H_2O$, $NO_2$, $N_2O$, or plasmas thereof. In one or more embodiments, the second reactive gas is selected to deposit a metal oxide, metal nitride or metal oxynitride film.

In some embodiments, the second reactive gas comprises a compound selected to form a metal silicide, metal silicate, metal carbide, metal carbonitride, metal oxycarbide, metal oxycarbonitride, or a metal film including one or more of O, N, C, Si or B.

In some embodiments, the second reactive gas comprises hydrogen and the resulting film formed is an metal film. The hydrogen gas may be supplied to the substrate surface at a flow rate greater than the metal-containing gas concentration. In one or more embodiments, the flow rate of $H_2$ is greater than about 1 time that of the metal-containing gas, or about 100 times that of the metal-containing gas, or in the range of about 3000 to 5000 times that of the metal-containing gas. The hydrogen gas can be supplied, in time-domain ALD, for a time in the range of about 1 sec to about 30 sec, or in the range of about 5 sec to about 20 sec, or in the range of about 10 sec to about 15 sec. The hydrogen gas can be supplied at a pressure in the range of about 1 Torr to about 30 Torr, or in the range of about 5 Torr to about 25 Torr, or in the range of about 10 Torr to about 20 Torr, or up to about 50 Torr. The substrate temperature can be maintained at any suitable temperature. In one or more embodiments, the substrate is maintained at a temperature less than about 475° C., or at a temperature about the same as that of the substrate during the metal-containing film deposition.

In some embodiments, the second reactive gas comprises hydrogen radicals. The hydrogen radicals can be generated by any suitable means including exposure of hydrogen gas to a "hot-wire". As used in this specification and the appended claims, the term "hot-wire" means any element that can be heated to a temperature sufficient to generate radicals in a gas flowing about the element. This is also referred to as a heating element.

The second reactive gas (e.g., hydrogen), while passing the hot wire, or heating element, becomes radicalized. For example, $H_2$ passing a hot ruthenium wire can result in the generation of H*. These hydrogen radicals are more reactive than ground state hydrogen atoms.

Next, at 112, the process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the generic embodiment of the processing method shown in the FIGURE includes only two pulses of reactive gases, it will be understood that this is merely exemplary and that additional pulses of reactive gases may be used. For example, a nitride film of some embodiments can be grown by a first pulse containing a precursor gas like metal pentachloride, a second pulse with a reducing agent followed by purging and a third pulse for nitridation. The pulses can be repeated in their entirety or in part. For example all three pulses could be repeated or only two can be repeated. This can be varied for each cycle.

Next, at 114, it is determined whether the metal-containing layer has achieved a predetermined thickness. If the predetermined thickness has not been achieved, the method 100 returns to 104 to continue forming the metal-containing layer until the predetermined thickness is reached. Once the predetermined thickness has been reached, the method 100 can either end or proceed to 116 for optional further processing (e.g., bulk deposition of an metal or other metal film). In some embodiments, the bulk deposition process may be a CVD process. Upon completion of deposition of the metal-containing layer to a desired thickness, the method 100 generally ends and the substrate can proceed for any further processing. For example, in some embodiments, a CVD process may be performed to bulk deposit the metal-containing layer to a target thickness. For example in some embodiments, the metal-containing layer may be deposited via ALD or CVD reaction of the metal precursor and hydrogen radicals to form a total layer thickness of about 10 to about 10,000 Å, or in some embodiments, about 10 to about 1000 Å, or in some embodiments, about 500 to about 5,000 Å.

Suitable co-reactants include, but are not limited to, hydrogen, ammonia, hydrazine, hydrazine derivatives, oxygen, ozone, water, peroxide, combinations and plasmas thereof. In some embodiments, the co-reactant comprises one or more of $NH_3$, hydrazine, hydrazine derivatives, $NO_2$, combinations thereof, plasmas thereof and/or nitrogen plasma to deposit a metal nitride film (e.g., $Ir_xN_y$). In some embodiments, the co-reactant comprises one or more of $O_2$, $O_3$, $H_2O_2$, water, plasmas thereof and/or combinations thereof to deposit a metal oxide film (e.g., $Ir_xO_y$). In some embodiments, the coreactant comprises one or more of $H_2$, hydrazine, combinations thereof, plasmas thereof, argon plasma, nitrogen plasma, helium plasma, $Ar/N_2$ plasma, Ar/He plasma, $N_2$/He plasma and/or $Ar/N_2$/He plasma to deposit a metal film (e.g., Ir).

Some embodiments of the disclosure are directed to metal precursors and methods of depositing metal containing films. The metal containing films of some embodiments comprises one or more of metal, metal silicate, metal oxide, metal nitride, metal carbide, metal boride, metal oxynitride, metal oxycarbide, metal oxyboride, metal carbonitride, metal borocarbide, metal oxycarbonitride, metal oxyboronitride and/or metal oxyborocarbonitride. Those skilled in the art will understand that the film deposited may have a nonstoichiometric amount of metal, oxygen, nitrogen, carbon and/or boron atoms on an atomic basis. Boron and/or carbon atoms can be incorporated from the metal precursor or the reactant.

In some embodiments, the metal-containing film comprises greater than or equal to about 95 atomic percent metal. In one or more embodiments, the sum of C, N, O and halogen atoms is less than or equal to about 5 atomic percent of the metal-containing film.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising exposing a substrate to a first reactive gas comprising a metal coordination complex and a second reactive gas to form a metal-containing film, the metal coordination complex comprising a metal atom and at least one ligand according to:

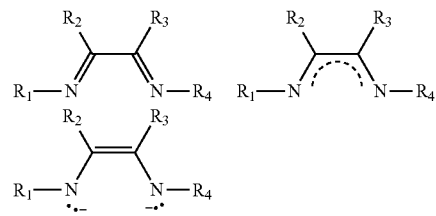

wherein:
R$_1$ and R$_4$ are selected from the group consisting of C4-C10 alkyl groups;
each of R$_2$ and R$_3$ are independently selected from the group consisting of H, C1-C6 alkyl, cycloalkyl, or aryl groups and the difference in the number of carbons in R$_2$ and R$_3$ is greater than or equal to 2; and
the metal atom is selected from Re, Ru, and combinations thereof.

2. The method of claim 1, wherein the substrate is exposed to the first reactive gas and the second reactive gas sequentially.

3. The method of claim 1, wherein the substrate is exposed to the first reactive gas and the second reactive gas simultaneously.

4. The method of claim 1, wherein the second reactive gas comprises one or more of $H_2$, $NH_3$, hydrazine, hydrazine derivatives, $O_2$, $O_3$, $H_2O$, $NO_2$, $N_2O$ or plasmas thereof.

5. The method of claim 1, wherein the second reactive gas comprises a silicon-containing compound and the metal-containing film comprises metal silicide ($MSi_x$).

6. The method of claim 1, wherein the metal-containing film comprises greater than or equal to about 95 percent metal.

7. The method of claim 1, wherein the metal atom is ruthenium.

8. The method of claim 1, wherein R$_2$ is an ethyl group and R$_3$ is hydrogen.

9. The method of claim 1, wherein $R_1$ and $R_4$ are 1,1-dimethyl propyl groups.

10. The method of claim 1, wherein $R_1$ and $R_4$ are t-butyl groups.

11. The method of claim 1, wherein $R_1$ and $R_4$ are 1,1-dimethyl propyl groups, $R_2$ is an ethyl group and $R_3$ is hydrogen.

12. The method of claim 1, wherein the metal coordination complex has the general formula:

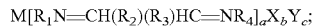

$M[R_1N{=}CH(R_2)(R_3)HC{=}NR_4]_a X_b Y_c;$ $R_1$ and $R_4$ are selected from the group consisting of C4-C10 alkyl groups;

$R_2$ and $R_3$ are each independently selected from the group consisting of H, C1-C6 alkyl, cycloalkyl, or aryl groups and the difference in the number of carbons in $R_2$ and $R_3$ is greater than or equal to 2;

X in an anionic ligand;

Y is a neutral ligand;

a is 1-4;

b is 0-8;

c is 0-8; and

M is selected from Re, Ru, and combinations thereof.

13. The method of claim 12, wherein $R_1$ and $R_4$ are 1,1-dimethyl propyl groups.

14. The method of claim 12, wherein $R_1$ and $R_4$ are t-butyl groups.

15. The method of claim 12, wherein $R_2$ is an ethyl group and $R_3$ is hydrogen.

16. The method of claim 12, wherein X is one or more of $F^-$, $Cl^-$, $Br^-$, $I^-$, $OH^-$, or $CN^-$.

17. The method of claim 12, wherein Y is one or more of $H_2O$, $NH_3$, CO, NO, $NR''_3$, $PR''_3$, dimethyl ether (DME), tetrahydrofuran (THF), tetramethylethylenediamine (TMEDA), acetonitrile, pyridine, ethylenediamine, or triphenylphosphine, and each R" is independently H, C1-C6 alkyl or aryl group.

18. The method of claim 12, wherein M is ruthenium.

* * * * *